United States Patent [19]

Craven

[11] Patent Number: 5,708,433
[45] Date of Patent: Jan. 13, 1998

[54] DIGITAL CONVERTER

[76] Inventor: Peter Graham Craven, Old School House, Main Street, East Challow, Wantage, Oxford OX12 9SG, United Kingdom

[21] Appl. No.: 600,989

[22] PCT Filed: Sep. 1, 1994

[86] PCT No.: PCT/GB94/01917

§ 371 Date: Mar. 1, 1996

§ 102(e) Date: Mar. 1, 1996

[87] PCT Pub. No.: WO95/06980

PCT Pub. Date: Mar. 9, 1995

[30] Foreign Application Priority Data

Sep. 2, 1993 [GB] United Kingdom ............... 9318238

[51] Int. Cl.$^6$ ........................................ H03M 1/66
[52] U.S. Cl. ........................................ 341/144; 375/23
[58] Field of Search ............................ 341/144, 143, 341/53, 147; 375/21, 22, 23, 25, 27, 26

[56] References Cited

U.S. PATENT DOCUMENTS 4,095,218  6/1978  Crouse ................................ 341/144
4,947,171  8/1990  Pfeifer et al. ...................... 341/143

FOREIGN PATENT DOCUMENTS 9215153  9/1992  WIPO.

*Primary Examiner*—Brian K. Young
*Attorney, Agent, or Firm*—Sughrue, Mion, Zinn, Macpeak & Seas, PLLC

[57] ABSTRACT

A digital converter includes a consecutive edge modulator and a noise-shaping circuit. The noise-shaping circuit modifies the input to the consecutive edge modulator in dependence upon values corresponding to the output of the consecutive edge modulator. The noise-shaping circuits apply different respective non-linear functions to samples corresponding to the trailing-edge and leading-edge outputs respectively of the consecutive edge modulator. The noise-shaping circuit may act upon an output simulating the output of the consecutive edge modulator for a given input sample value. A look-up table may be used to simulate the consecutive edge modulator output

26 Claims, 11 Drawing Sheets

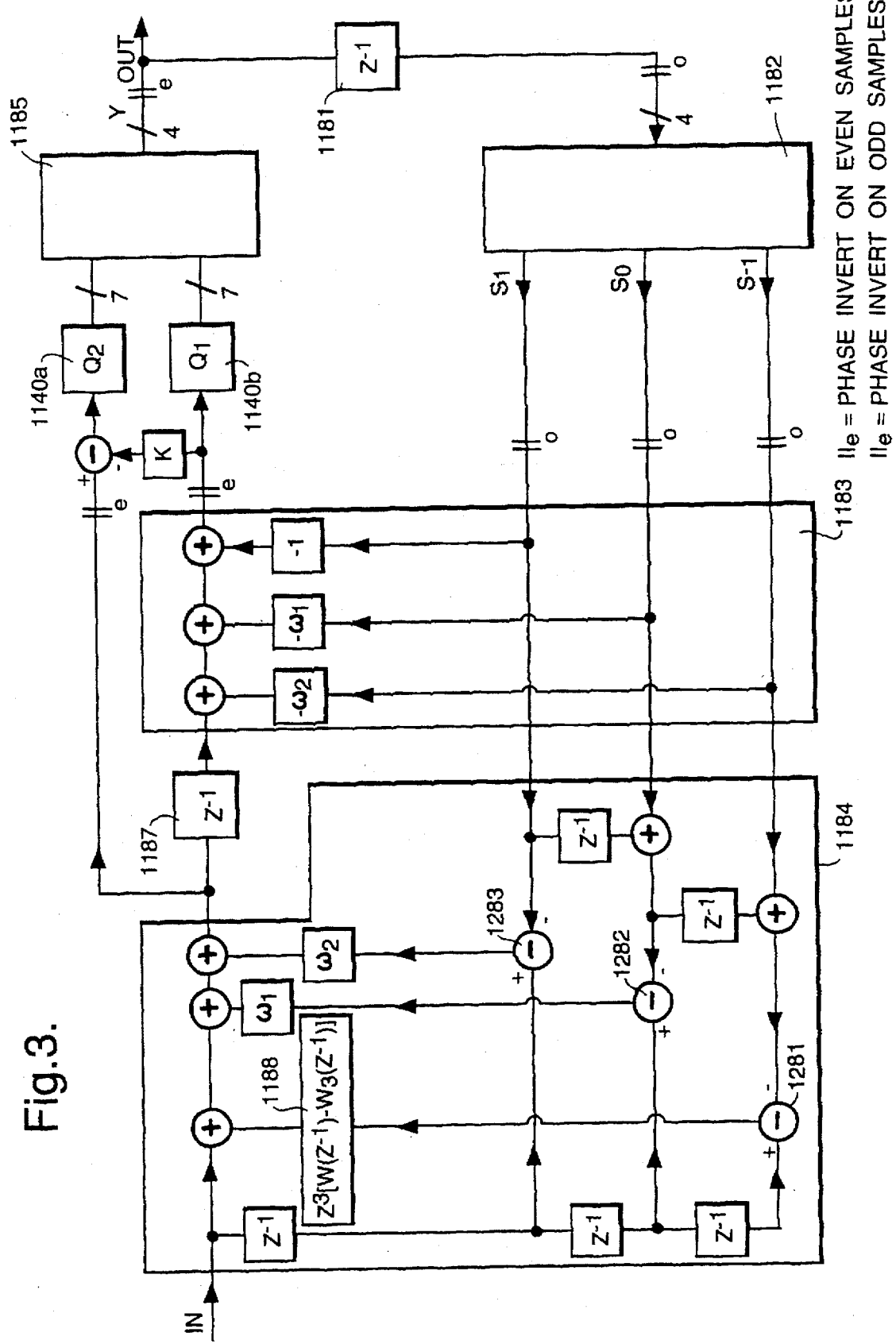

DIGITAL CONVERTER

BACKGROUND TO THE INVENTION

An attractive way of producing high quality digital to analogue converters (DACs) for use in Audio and other applications is to produce a pulse-width-modulated waveform in which pulses are of constant height but in which the timings of one or both edges of each pulse is modulated in response to the incoming digital signal.

In this field of use, the pulse repetition frequency is typically of order 3 MHz (64 times the original sampling rate), and the edge timings are typically determined by counting the cycles of a crystal clock (the bitclock) with frequency up to 50 Mhz. The resulting waveform contains the desired audio modulation plus strong signals at 3 MHz and its harmonics, which are substantially removed by a low-pass filter.

A closely related field is the use of pulse-width-modulation (PWM) in power amplifiers, in particular in "Digital" power amplifiers. The Digital Power Amplifier can be regarded as a DAC operating at a high power level. In this case considerations of power dissipation and switching speed in the output devices impose strong practical reasons for using a pulse repetition frequency (switching frequency) as low as possible. Typically the switching frequency is no more than 8 to 16 times the original sampling frequency. For reasons to be explained, this reduction in switching frequency entails an increase in the bitclock frequency if the same signal-to-noise ratio is to be maintained in the audio band, and bitclock frequencies of 100 MHz or more have been contemplated in this field.

In general it is necessary to use an oversampler, or interpolator, to produce digital samples representing the original audio waveform but at a higher sampling rate than is normally used for storage or transmission. Having done this, there are several ways in which these (oversampled) digital samples may be used to modulate the positions of the pulse edges (see FIG. 1):

(a) Leading-edge modulation: each digital sample modulates the timing of the leading-edge of the corresponding pulse (b) Trailing-edge modulation: ditto, trailing-edge (c) Double edge modulation: the two edges of the pulse are shifted in time in opposing directions, in response to the digital sample value (d) Consecutive edge modulation (CEM): the trailing-edge of a pulse is modulated in response to one sample value, and the trailing-edge in response to the following sample value.

(a) and (b) are not in fact fundamentally different from each other, and one can transform from one to the other by adopting the opposite convention about which electrical polarity is labelled "positive".

It will be seen that in modulation types (a), (b) and (c) the pulse repetition frequency is the same as the oversampled sampling frequency, but in consecutive edge modulation it is one half of this frequency.

It is recognised in the prior art that the PWM process is fundamentally non-linear. For example if a small high-frequency modulation and a large low-frequency signal are simultaneously applied to leading-edge modulation, the low-frequency signal will move the edge backwards and forwards in time, thus giving a time-varying phase-shift to the high-frequency signal. The literature [1, 2] contains various schemes for dealing with this problem at least partially.

Any of the above modulation schemes can in principle be implemented using circuits in push-pull mode, though this is more practical in the case of DACs than in the case of power amplifiers. Push-pull operation cancels even order distortions (such as the phase-shift mentioned above) and has been proposed for DACs. See [3] and also pp 19–20 of our earlier application number PCT/GB 92/00312.

It will also be appreciated that the resolution implied by the above figures is totally inadequate for high quality audio. With a 3 MHz switching frequency and a bitclock rate of 48 MHz the pulse length is quantised to only 16 possible lengths giving a 4 bit resolution. Even with the possible sqrt(n) advantage of oversampling, we have only 7 bits or 42 dB signal-to-noise ratio.

It is widely recognised that the solution to this problem is to use noise-shaping, a technique that allows noise in a quantised system to be substantially reduced in a given frequency band (e.g. the audio band) at the expense of its being increased at other frequencies. This is discussed in pages 1–21 of our above-cited co-pending international application and loc. cit.

Simple noise-shaping operates by attempting to balance an error in the sample by an equal and opposite error on the next sample. If the output is measured through a low-pass filter, the final waveform will show a much reduced error even though the correction did not occur at exactly the correct point in time. More complicated schemes make use of the fact that error sequences such as (1, -2, 1) will have even less effect when viewed through a low-pass filter. A moments analysis is helpful here, and we can note that an isolated error:

1 has a non-zero zeroth moment; a pair:

1, -1 has a zero zeroth moment but a non-zero first moment; the triplet

1, -2, 1 has zero first moment but non-zero second moment, and so on.

The above analysis assumes that the samples are presented at equally-spaced points in time—the (1, -2, 1) sequence will not have a zero first moment if the spacing is unequal. With PWM, the phase-modulation effected noted above does introduce inequality of spacing, however a gently concertina-ing timebase is not too much of a problem and with modulation schemes (a)–(c) the noise-shaping continues to give a useful improvement.

With consecutive edge modulation, (CEM) however, as successive edges are being modulated in opposite directions, even a low-frequency modulation will cause gross inequality between successive intervals between edges and under these conditions conventional noise-shaping techniques break down substantially.

A solution to this problem proposed by M. B. Sandler [private communication] is to apply noise-shaping separately to the odd samples and the even samples, i.e. to those that modulate the leading-edges and to those that modulate the trailing-edges. (This is elegantly implemented by replacing each occurrence of $z^{-1}$ in the noise-shaping formulas by $z^{-2}$.) We shall refer to this technique as "Interleaved Noise-Shaping".

The electrical output produced by CEM with interleaved noise-shaping is equivalent to that of leading-edge modulation with ordinary noise-shaping, plus that of trailing-edge modulation with ordinary noise-shaping. The advantage over plain leading or trailing-edge modulation is that these two modulations have the same even-order distortion terms but with opposite signs: thus CEM gives a cancellation advantage similar to push-pull, but without requiring a push-pull electrical configuration.

However, one big potential advantage of CEM is sacrificed when interleaved noise-shaping is used. This is related to the fact that the effectiveness of noise-shaping depends very strongly on the oversampling ratio. CEM would therefore give a strong advantage when the switching frequency is limited (as in power amplifiers) by allowing the oversampling frequency to be twice as great. However, with interleaved noise-shaping, each separate noise-shaping process sees an oversampling frequency equal to the switching frequency, so this advantage has been lost.

(The above consideration also explains why, in digital power amplifiers where the switching frequency is lower than in a DAC, one is led to consider using higher bitclock rates in order to regain signal-to-noise ratio.)

Referring to our earlier application No. PCT/GB 92/00312, recall firstly that in the context of an oversampling converter, the noise-shaper provides an enormous reduction in quantisation noise in the baseband, but only at the expense of an increase in wideband noise. The total noise power is increased by typically 1–4 bits (4× to 256×, expressed as a power ratio). The larger the amount of noise-shaping required and the lower the oversampling ratio, the larger must this wideband noise penalty be.

In Application No. PCT/GB 92/00312 (WO92/15153) ("Analogue and Digital Converters"), the disclosures of which are incorporated herein by reference, it is explained that schemes such as [1] and also [2] are only partial solutions to the problem of PWM non-linearity. They are both effective in the context of continuously-variable pulse edges, but quantisation is treated as a small perturbation that can be ignored.

It is explained in the application that, if distortion correction is applied first, followed by noise-shaped quantisation, the wideband noise introduced by the noise-shaper does not participate in the distortion correction. This noise is therefore subject to the PWM non-linearity, which will have the effect of creating intermodulation products that lie in the audio band. The more noise-shaping one uses to push quantiser noise out of the audio band, the higher will be the wideband noise level and greater will be the intermodulation products. This sets a practical performance limit in the region of 14–16 bits for single-ended, single-edge modulators, or 22 bits for push-pull modulators.

One cannot avoid this effect by placing the noise-shaped quantiser before the distortion compensation, for the distortion compensator would generate corrections that were a fraction of a quantisation level, and the principle of counting clock cycles would be lost.

The previous application concludes that the quantisation noise-shaping and non-linearity correction need to be designed as a single unit, and a number of examples are presented in which the noise-shaping feedback loop includes a "Simulation ROM" which models the PWM non-linearity. To improve stability at higher modulation levels, and also to improve the cancellation of distortion components, preferred embodiments are described which include also a ROM providing a non-linear transfer function in the forward path, and even more preferably this ROM may have one or more "look-ahead" inputs as well as the usual signal.

We shall refer to this technique described in the previous applications as "Non-linear noise shaping" (NLNS).

SUMMARY OF THE INVENTION

According to a first aspect of the present invention, there is provided a digital converter including a consecutive edge modulator, and a noise-shaping circuit arranged to modify the input to the consecutive edge modulator in dependence upon values corresponding to an output of the consecutive edge modulator, characterised in that the noise-shaping circuit is arranged to apply different respective non-linear functions to samples at time instants corresponding to trailing-edge and leading-edge outputs respectively of the consecutive edge modulator.

The digital converter may be a DAC, but is not limited in this respect. It may alternatively, for example take an analogue input which is sampled and then processed to provide the control input to the CEM.

The means for applying different respective non-linear functions may comprise a non-linear processor means together with means for conditionally negating one or more inputs and/or outputs to/from the non-linear processor means depending on whether the output corresponds to a leading-edge or a trailing-edge. The negation may be applied directly at the input to the ROM's, or at an earlier stage, e.g. at the input to the converter with $-z^{-1}$ substituted for $z^{-1}$ and the feedback modified where appropriate.

Alternatively, the means for applying may comprise different non-linear processor means corresponding to the different respective non-linear functions.

It will be clear from the two above discussions that non-linear noise-shaping could be applied to CEM separately on the leading and trailing-edges, and that the resulting "Interleaved NLNS" would work but would fail to exploit the potential oversampling advantage of CEM just as ordinary interleaved noise shaping does.

The present invention uses a modification to non-linear noise-shaping as described in the previous application, which allows the noise-shaping to make trade-offs between the errors on the upward and downward edges, thus fully reaping the advantages of an oversampling frequency twice the switching frequency.

According to a second aspect of the present invention, there is provided a digital converter including a non-linear noise-shaping circuit arranged to apply a non-linear function generally of the form shown in FIGS. 5 and 6a, 6b and 7. Preferably the non-linear function is implemented as a look-up table stored in a region of non-volatile memory such as a ROM.

According to a third aspect there is provided a digital converter including a consecutive edge modulator, and a noise-shaping circuit arranged to modify the input to the consecutive edge modulator in dependence upon values corresponding to an output of the consecutive edge modulator, characterised in that the noise-shaping applied to the input of the consecutive edge modulator is effective at an oversampling frequency equal to twice the switching frequency of the output of the consecutive edge modulator and in that the level of noise-reduction within the baseband effected by the noise-shaping circuit is substantially independent of the signal modulation level.

The present invention for the first time makes possible the construction of a converter using CEM in which noise-shaping is effective at the full doubled oversampling rate with the noise reduction maintained for substantially all modulation levels (except of course extremes of overload). The design principle set out in the description below enables the construction of a wide number of different circuits and so the present invention is not limited to any one specific architecture. In particular, the invention encompasses the variety of circuits which, as will be evident to those skilled in the art, can be derived by systematic transformation of the circuits of the specific embodiments.

According to a fourth aspect of the present invention, there is provided a method of operating a digital converter including a consecutive edge modulator, the method including applying noise-shaping to the input to the consecutive edge modulator, characterised by applying different respective non-linear functions to samples corresponding to trailing edge and leading edge outputs respectively of the consecutive edge modulator.

DESCRIPTION OF THE DRAWINGS

Examples of a system in accordance with the present invention and the theoretical background to the present invention will now be discussed in further detail with reference to the accompanying drawings, in which:

FIG. 3 shows schematically details of a converter embodying the present invention;

FIG. 5 shows the contents of a look-ahead ROM table for use with consecutive edge modulation;

FIGS. 6(a) and 6(b) are listings of the look-ahead ROMs for trailing-edge modulation;

DESCRIPTION OF EXAMPLES

FIG. 1 as discussed above shows respectively leading-edge, trailing-edge, double edge and consecutive edge modulation. In the Figure, the lateral arrows show the direction of movement of the edge as sample values become more positive. The curved arrows in FIG. 1(c) show information flow from the sample values (at instants marked below the line) and the corresponding modulated edges.

FIG. 2 shows in detail the relationship between the effect of modulation of a leading and a trailing-edge. At (a) we see a leading-edge with possible time-shift due to modulation, and at (b) we see the corresponding difference from the waveform with no modulation. Similarly (c) and (b) for the trailing-edge. In all cases, increasing "x" corresponds to a more positive mean signal value.

If we represent the effect of leading-edge modulation (b) by the function $$f(x, t),$$

where x is modulation value and t is time, then comparing (b) with (d) it is clear that the corresponding function for the trailing-edge modulation is $$-f(-x, t)$$

Considering f to be expanded in powers of x, we see that the linear term is unchanged by this transformation, but the first non-linear term (quadratic in x) has its sign reversed.

The general structure of one embodiment of a converter employing non-linear noise-shaping in accordance with the invention described in our above-cited earlier application will now be described with reference to FIG. 8. In this digital-to-analogue converter, a 32 bit input signal is applied first to a noise-shaping network 30. The signal as modified by the network 30 is then supplied to a quantiser 40 which will typically have a linear staircase characteristic. The quantiser 40 generates a 4 bit output sample corresponding to each 32 bit input sample. The 4 bit output of the quantiser 40 is also fed to the pulse width modulator 50 which, in the case of trailing-edge or leading-edge modulation as described in the earlier application, generates a pulse having a fixed amplitude and a width which corresponds to the 4 bit output of the quantiser. The quantiser operates at a oversampling ratio of 64. Therefore, for a signal having a bandwidth of 20 kHz the sampling rate of the quantiser and hence the output rate of the PWM 50 is at least 2.56 MHz. The analogue output line from the pulse-width-modulator 50 is fed to a low-pass filter (not shown) which integrates or averages the pulses to produce the required analogue output signal.

Figure 8:
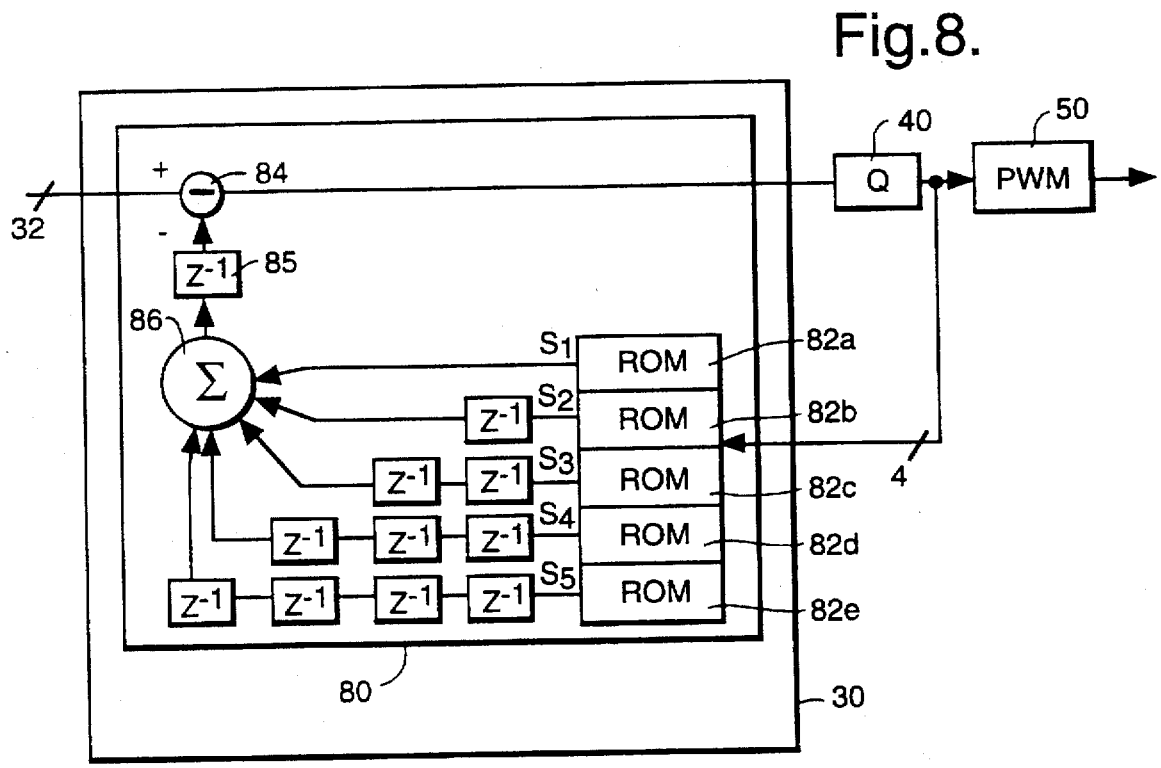
FIG. 8 shows schematically one example of a converter as proposed in our earlier application.

In the circuit shown in FIG. 8, the network 80 comprises a number of ROMs which are addressed by a 4 bit output taken from the output of the quantiser 40. These ROMs are preprogrammed to give an output as a function of the input signal from the quantiser 40 which models the non-linear characteristics of the system including the pulse width modulator 50 so as to generate appropriate correction impulses for successive sampling instants S1, S2 . . . . As described in the specification of the earlier application, the non-linear noise-shaping technique may be extended to apply corrections for the non-linearity of a present sample in the form of correction impulses applied to a preceding sample. This is effected by placing differential delays in the forward signal path and providing additional "look-ahead" ROMs to generate the appropriate correction impulses.

In deriving the non-linear noise-shaping algorithms, the previous application does not consider the possibility that the PWM non-linearity may be represented by different functions on different samples. However it is straightforward to extend the analysis to cover this possibility.

The result of such extension is the following list of modifications to designs disclosed in our earlier application. Here, the figure numbers refer to the previous application:

(i) The pulse-width-modulator (block 50 in FIGS. 4(a), 4(b) and elsewhere) needs appropriate modification to modulate both the leading and trailing-edges.

Figure 11B:
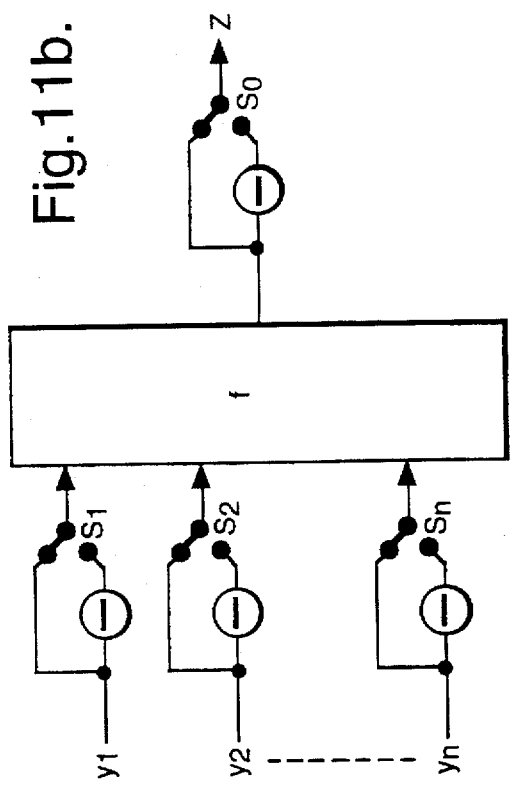
FIGS. 11a and 11b shows an alternating function generator.
Figure 11A:
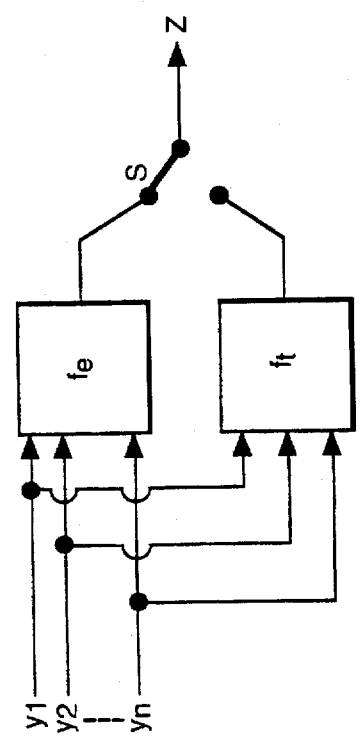

(ii) The simulator means 82a–82e in FIG. 11(a) and 11(b) need to be duplicated and multiplexed to allow for the different non-linearity on even and odd samples. Each means is conditioned as in the previous application for the appropriate type of edge that its sample stream will modulate (i.e. leading or trailing).

It is alternatively possible to condition a single means and to negate its inputs and outputs on every alternate sample. This negation corresponds to the relationship between the non-linearity in the two cases: $f(x) \leftrightarrow -f(-x)$.

Where the input samples to the simulator means are delayed by one or more $z^{-1}$ delays, as in FIG. 11(c), care must be taken to determine the edge type (leading or trailing) that the sample originally modulated, rather than the edge type that is being modulated at the current instant.

Similar remarks apply to the simulator block 82 in FIGS. 12(a), 12(b), 13, 15, 18, 19 and to blocks 682 and 782 in FIG. 27, to blocks 882 a, b, c in FIGS. 28 and 29, to block 1182 in FIGS. 32, 33, 34 and 37.

(iii) Similarly, the ROMs in the forwards path, where present, need to be duplicated, or to have both input(s) and output negated on alternate samples. This applies to block 889 in FIG. 29, block 1140 in FIG. 31, and block 1185 in FIGS. 32, 33, 34 and 37.

(iv) Care needs to be taken in deriving those forward-path ROMs that have more than one input. Referring to FIG. 39 of the previous application, the simulator whose input is Y1 alternates between being a leading-edge simulator and a trailing-edge simulator. The simulator whose input is Y2 alternates in antiphase, between being a trailing-edge simulator and a leading-edge simulator. Similarly Y3 alternates in phase with Y1.

If we choose not to duplicate the forward-path ROMs but to negate the inputs and outputs on alternate samples, this effectively takes care of the alternation of the Y1 and Y3 simulators. However we need to recognise explicitly at generation time the fact that the Y2 simulator is alternating in antiphase; this is done by (unconditionally) negating the inputs and outputs of the Y2 simulator at generate time.

Once these rules have been followed, both the leading and the trailing-edge modulations will have been linearised and hence have become nearly equivalent to each other, at least as far as the audio band is concerned. Hence the difficulties mentioned earlier about noise-shaping and CEM, those of modulation-induced inequality in the effective intervals between pairs of samples, no longer apply and it becomes possible to take advantage of noise-shaping at an oversampling frequency twice that of the switching frequency.

Practical Example

In order to illustrate the above ideas a practical example will now be presented of a non-linear noise-shaper like that of FIG. 33 of the previous application but modified for use with CEM, operating at an oversampling ratio of 64 (hence with a switching frequency of 32 times the original sampling frequency), with a bitclock frequency 16 times the oversampling frequency, and with a noise level in the baseband approximately 26 bits below the assumed maximum modulation level of 50%.

FIG. 3 shows the non-linear noise-shaper, c.f. FIG. 33 of the previous application and FIG. 21 of [5]. The output of this circuit is a 4-bit word which drives the Consecutive Edge Modulator (CEM) (not shown).

The ROM 1185 performs the essential quantisation of the higher-precision signal to 4-bits. The pre-quantisers Q1 and Q2 are provided purely to limit the number of address lines driving the ROM 1185, and hence its size. (In this example, a total of 14 address lines and hence a size of 16384 words of 4-bits.)

The signal paths not marked with a width in FIG. 3 are ideally high-precision, for example 32-bits, though in a practical implementation one may, for economy, limit the precision of these paths as far as is possible, consistent with the quantisation errors thus generated being acceptable.

For the purpose of description we shall temporarily ignore the signal path via the quantiser 1140a.

Blocks 1184, 1187, 1183 and 1181 perform the linear filtering functions of the noise-shaper, while the 3 look-up tables comprising block 1182 (the "simulator ROM") form the non-linear element in the feedback path. As explained in [5], compensation of the known modulator non-linearity is achieved by simulating the non-linearity by means of ROM 182, and feeding this signal back to the noise-shaper so that the errors due to the non-linear component may be reduced as far as is possible, within the baseband, by feedback.

Regardless of whether PWM or CEM is used, and as further explained in [5], the modulator non-linearity cannot be modelled by a single non-linear transfer function, as the waveform errors occur at times other than the nominal sampling instants. Conceptually a continuous-time representation would be required, but in practice an adequate representation can be obtained by considering the error associated with each modulated edge separately, and by modelling each such error by assigning impulses to a small number of sampling instants before and/or coincident with and/or after the sampling instant corresponding to the unmodulated position of the edge in question. In FIG. 3, ROM 1182 assigns the impulses S1, S0 and S-1 to three such instants, and as discussed in [5], this enables the action of the PWM to be modelled within the baseband to a relative accuracy of about $3.4 \times 10^{-7}$. (The values in the ROM 1182 are listed in FIG. 7.)

In the example of FIG. 3, the noise-shaping filter is a 5-th order recursive design. Reference [5] discusses the optimisation of this design to provide about 20 bits reduction of the quantisation noise with the baseband, at the expense of an increase of about 1.5 bits wideband. This tradeoff is made using the theory developed in [4]. FIG. 36 of the previous application (WO92/15153) discloses a suitable topology for the core of the filter 1188 with values of the coefficients disclosed in the text thereof (pp 75–76). The coefficients w1 and w2 in FIG. 3 are the coefficients of the $z^{-1}$ and $z^{-2}$ terms of the power-series expansion of the "noise-weighting filter" $w(z^{-1})$ (see [5]), having values w1=2 w2=3.8732 and the notation $w3(z^{-1})$ refers to the first three terms in the power series expansion: $w3(z^{-1})=1+w1.z^{-1}+w2.z^{-2}$.

In a more elementary design, not incorporating the features of "same sample correction" or "look-ahead" discussed in [5], the output of block 1183 would form the input to the quantiser. To incorporate "same sample correction", the quantiser is preceded by a non-linear function generator or alternatively the non-linear function generator plus quantiser can be replaced by the pre-quantiser 1140b and the ROM 1185, as in FIG. 3.

The design shown in FIG. 3 incorporates "look-ahead"; this is performed by the path from 1184 to 1140a, which bypasses the delay 1187 and provides some information relating to the signal which will be expected at the input to 1140b on the NEXT sample.

The subtraction node immediately prior to 1140a, which subtracts "k" times the signal at 1140b, is, as discussed in [5], merely a device for reducing the required size of the ROM 1185, and is not an essential part of the design.

The impulses $S_{-1}$, $S_0$, $S_1$ simulating the audio frequency effect of the output of the pulse width modulator corresponding to the input Y thereto are fed back, weighted by the first three terms respectively of the impulse response of the noise weighting filter, and subtracted from the signal supplied to the quantiser 1140B in the network 1183. In the network 1184, the samples are differentially delayed for time alignment, summed and subtracted from the thrice delayed input signal at a subtraction mode 1281, and the difference is filtered in a filter 1185 response $Z^3[W(Z^{-1})-W_3(Z^{-1})]$, and added to the input signal prior to the delay 1187.

It will be seen that, relative to the earlier circuit, in the circuit of FIG. 3, phase-inversion on alternate samples has been applied to the inputs and outputs of the simulator ROM 1182 and to the look-ahead ROM 1185. Because there is a $z^{-1}$ delay between the output of 1188 and the input of 1182, even samples of 1185 map to odd samples at 1182 and the phase-inversion must reflect this.

One must also be clear of course about which samples (even or odd) modulate which type of edge (leading or trailing). FIG. 3 would be correct if the even samples at 1185 output modulate leading edges, and simulator 1182 is conditioned for trailing edges, or alternatively if the even samples modulate trailing edges, and the simulator is conditioned for leading edges.

A further change in FIG. 3 relative to the previous application, is the subtraction of "K" times the input to the Q1 quantiser from the Q2 quantiser. This subtraction represents a shear transformation on the input variables to the ROM, the contents of which are adjusted accordingly. As, without this subtraction, the two inputs to the ROM are in practice highly correlated, the subtraction reduces the range of values presented to the Q2 input substantially and thus allows a smaller ROM size. With the various w-values (w1=2 approx) as given in the previous application, a value K=3 is suitable and allows the ROM size to be reduced by a factor 4 or more.

Figure 1A:
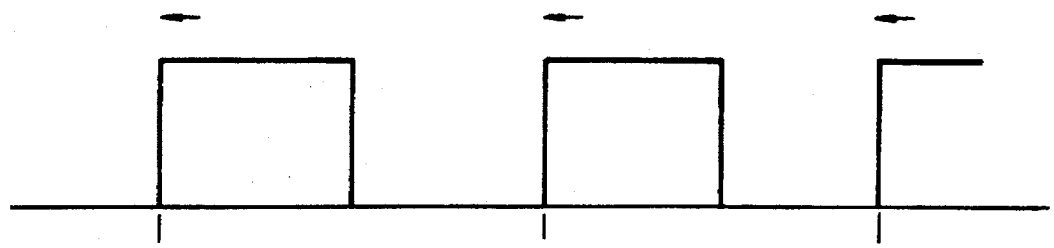
FIGS. 1(a) to 1(d) are timing diagrams showing different modulation types.
Figure 1B:
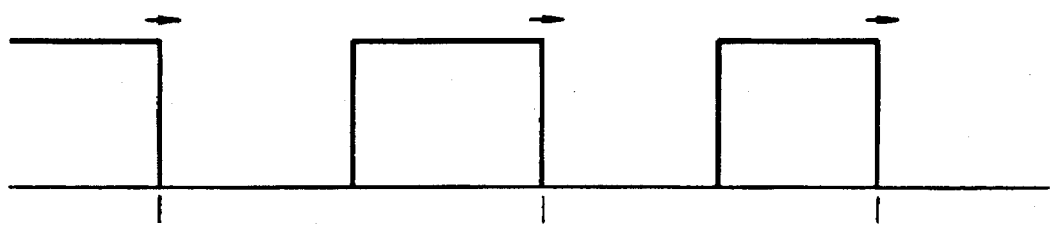
Figure 1C:
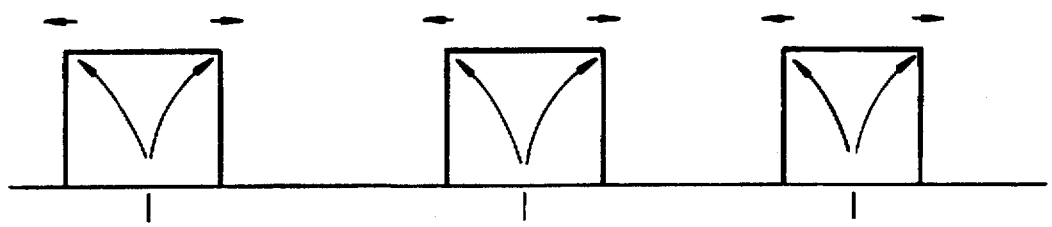
Figure 1D:
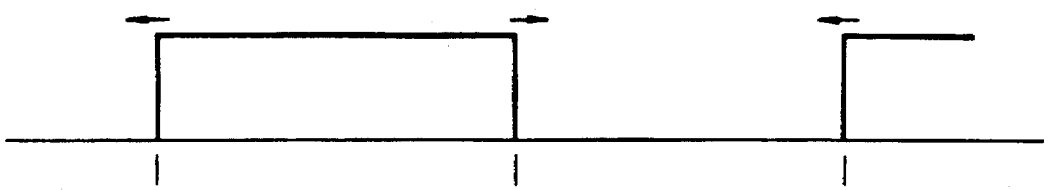
Figure 2A:
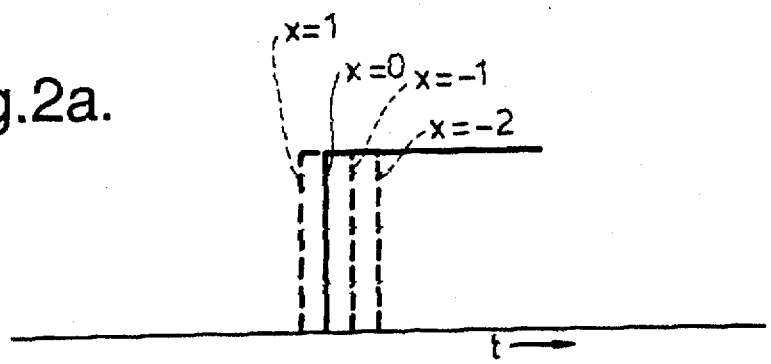
FIG. 2 shows the effect of modulation on a leading-edge and a trailing-edge.
Figure 2B:
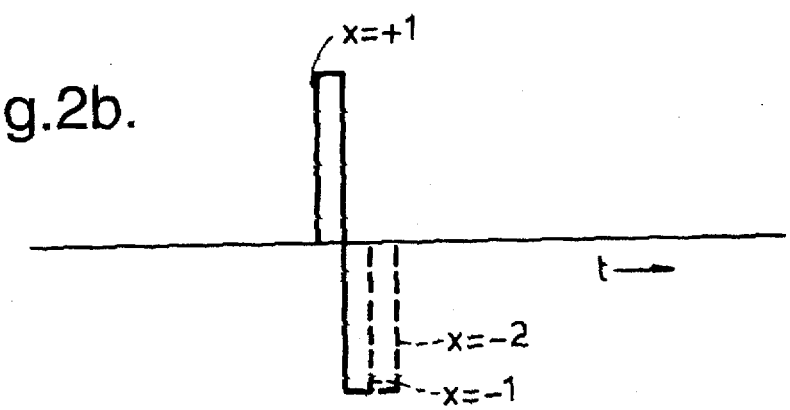
Figure 2C:
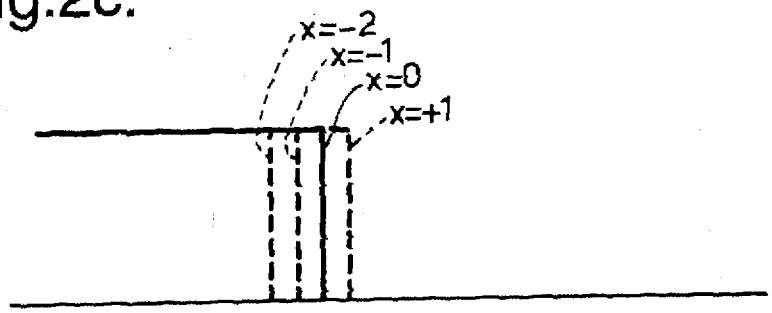
Figure 2D:
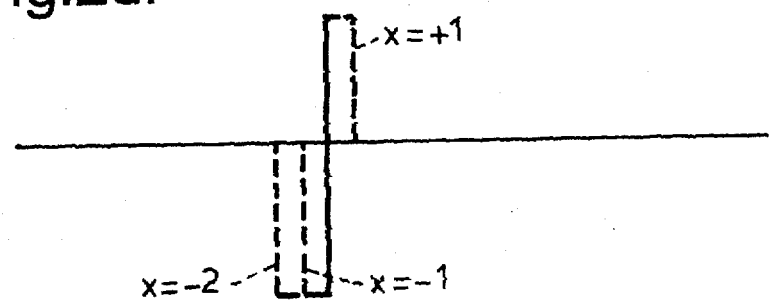
Figure 4:
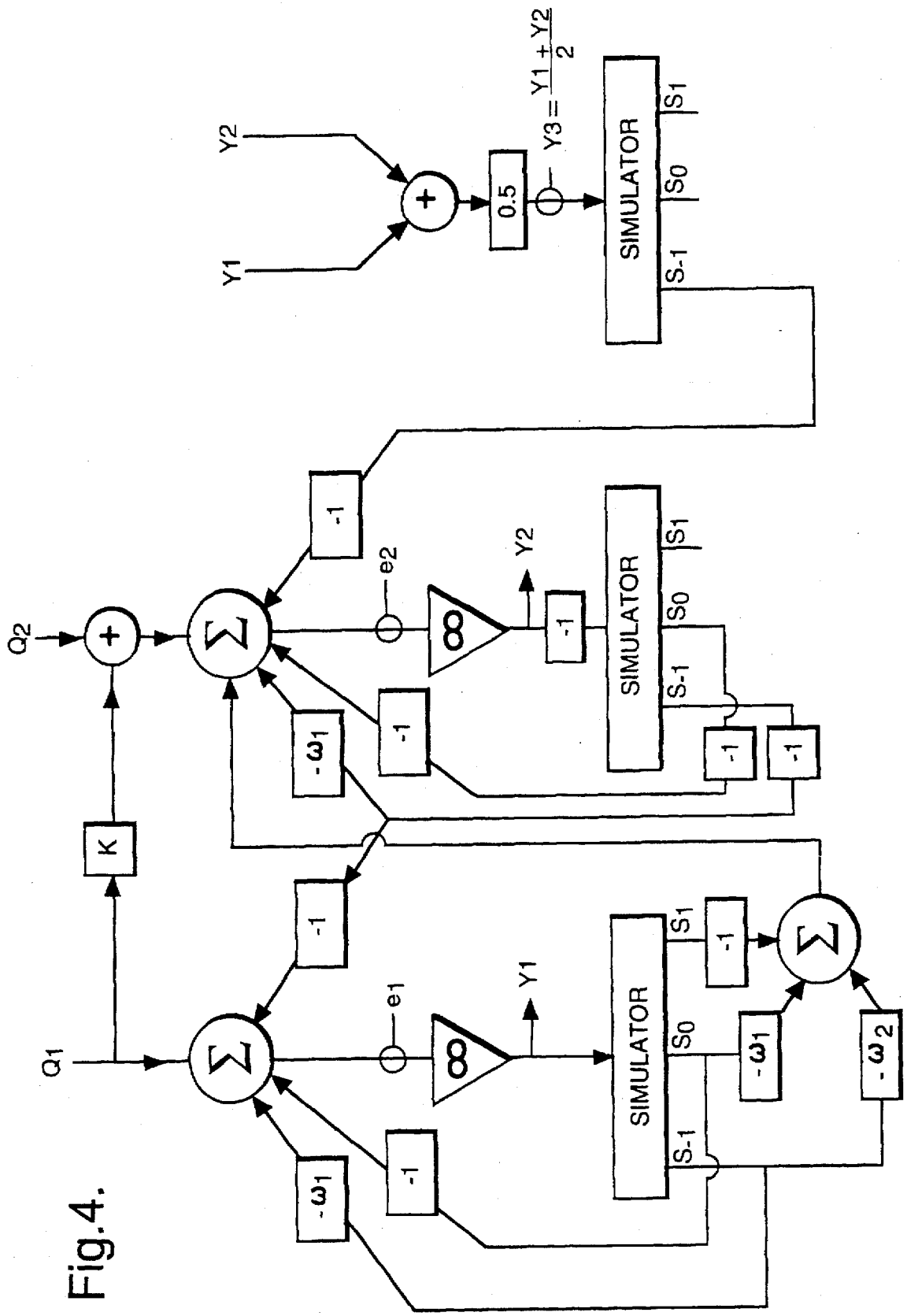
FIG. 4 illustrates the process for deriving the contents of a look-up table for use with the circuit of FIG. 3.

The derivation of the "look-ahead ROM" 1185 is carried out as follows. Reference [5] explains the derivation in the case of a PWM modulator, and this is now extended to the CEM case. FIG. 4 shows a signal-flow diagram which represents the non-linear equations that have to be solved. It will be seen that this is very similar to FIG. 17(c) of [5].

FIG. 4 can be interpreted as follows. We are given the "current" input signal Q1 and the "look ahead" signal Q2. We wish to choose the CEM input Y1, and its corresponding (estimated) value on the next sample Y2 so as to minimise the (estimated) errors on the current sample e1 and on the next sample e2. (This equation-solving process is represented symbolically by the two infinite-gain op-amps, which are assumed to adjust their outputs until their inputs are zero.)

It will be seen for example that the error signal e1 consists of the "desired" signal Q1 minus some terms derived from the simulators. For any supposed values Y1, Y2, the simulators can furnish a representation (accurate within the baseband) of the output of the CEM. In this case 3 terms are used, thus each modulated edge is assumed to have an effect on the previous sample, the current one, and the next one. S0 is the effect on the current sample, and in the case of the Y1 simulator, this contributes to the error term e1 with coefficient −1, as expected. S1 is the effect on the next sample, hence S1(Y1) contributes to the error term e2 also with coefficient −1.

More difficult to explain are the paths with coefficients w1 and w2. These arise because what is being optimised is not the actual error at each instant, but the error weighted by the "noise-weighting filter" $W(z^{-1})$, as explained in [5].

The condition that the e1 and e2 values should both be zero can be expressed in terms of the (non-linear) equations:

| Q1 | = | | | w1.S-1 (Y1) | + | S0 (Y1) |
|---|---|---|---|---|---|---|
| | | | | | − | S-1 (-Y2) |
| Q2 + k.Q1 | = | w2.S-1 (Y1) | + | w1.S0 (Y1) | + | S1 (Y1) |
| | | | | − w1.S-1 (-Y2) | − | S0 (-Y2) |
| | | | | | + | S-1 (Y3) |

The last term of the second equation involves Y3, interpreted as a prediction of the modulator input two samples hence. To avoid having to make such a prediction accurately, a simple estimate is inserted here:

$Y3=(Y1+Y2)/2$.

For a given Q1 and Q2, we now have 3 equations for the 3 unknowns, Y1, Y2, Y3 and ignoring quantisation of the Y values, the values e1 and e2 may both be forced to zero when the Q1 and Q2 values are within a reasonable range.

Only the Y1 result is used from this calculation, since this is the value that needs to be stored in the ROM 1185. However two further issues need to be addressed before this is done: quantisation and overload.

Quantisation may be dealt with by simply quantising the calculated Y1 value to the nearest permissible level accepted by the CEM modulator; however other possibilities exist, such as exploring the consequences of using the two nearest quantised values (one on each side of the "exact" Y1 value) and choosing whichever gives rise to the smaller e1. Because of the non-linearity, the two procedures may give different answers.

Reference [5] explains, for the PWM case how overload can be pre-empted by adjusting Y1 if the calculated Y2 value is outside the permissible range. The same principles can be applied in the CEM case, though it may be less necessary with CEM if the modulator is such that an edge may be allowed to "encroach" on to its neighbour's territory, provided of course that no edge-crossing occurs.

The above process is repeated for all values Q1, Q2 that correspond to valid addresses in the ROM 1185 (or at least, to that subset values that is expected to be exercised in practice), and the resulting Y1 value (after quantisation and possible overload adjustment) stored at the corresponding address.

The important change in FIG. 4 relative to the earlier diagram is the negation of the inputs and outputs of the middle simulator (fed from Y2), accounting for the fact that this simulator represents modulation of an edge of the opposite type from its two neighbours.

At the top of the diagram, FIG. 4, is the addition of K times the Q1 input to the Q2 input, to take account of the subtraction introduced in FIG. 3.

Figure 5I:
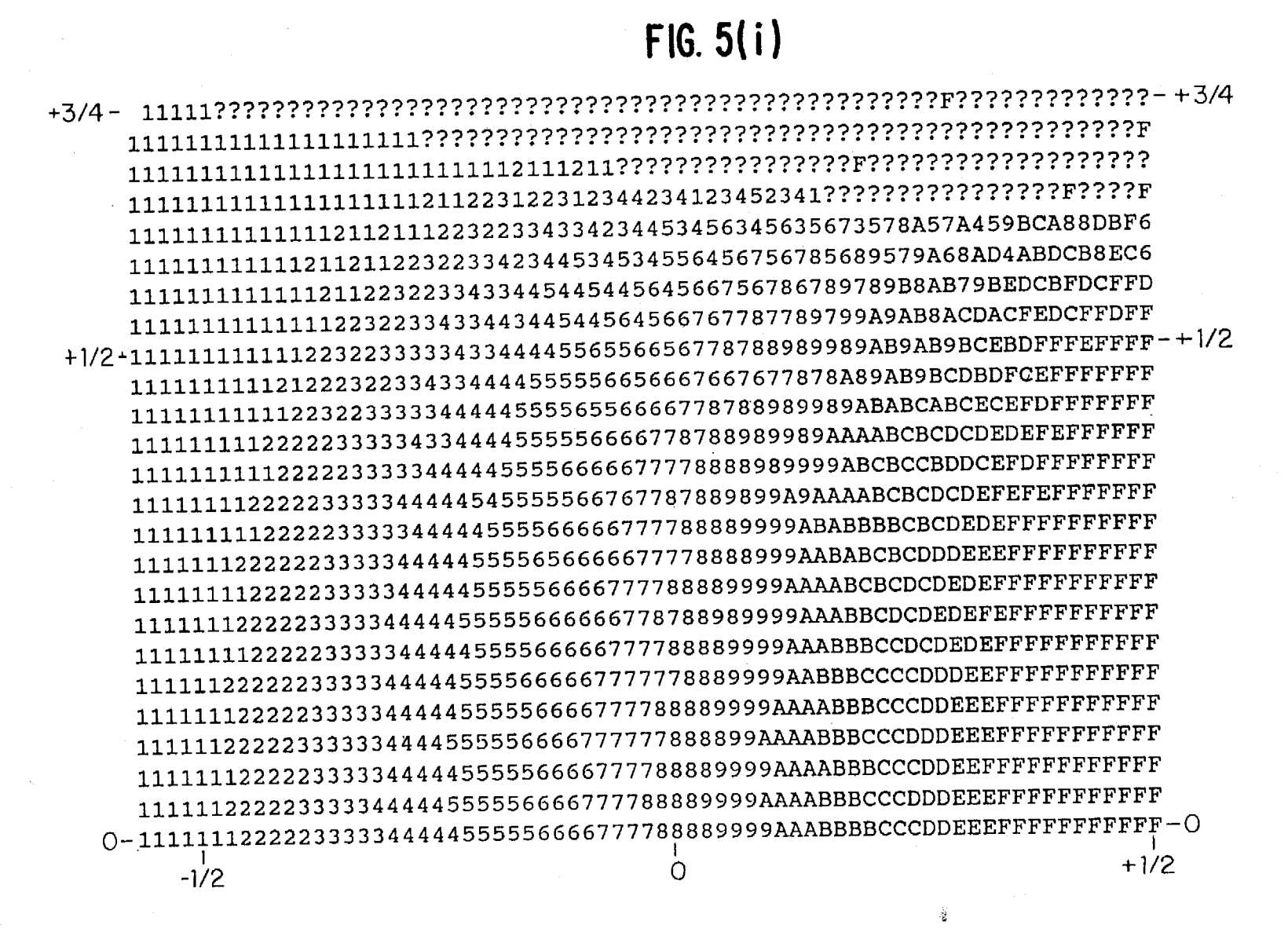
Figure 5II:
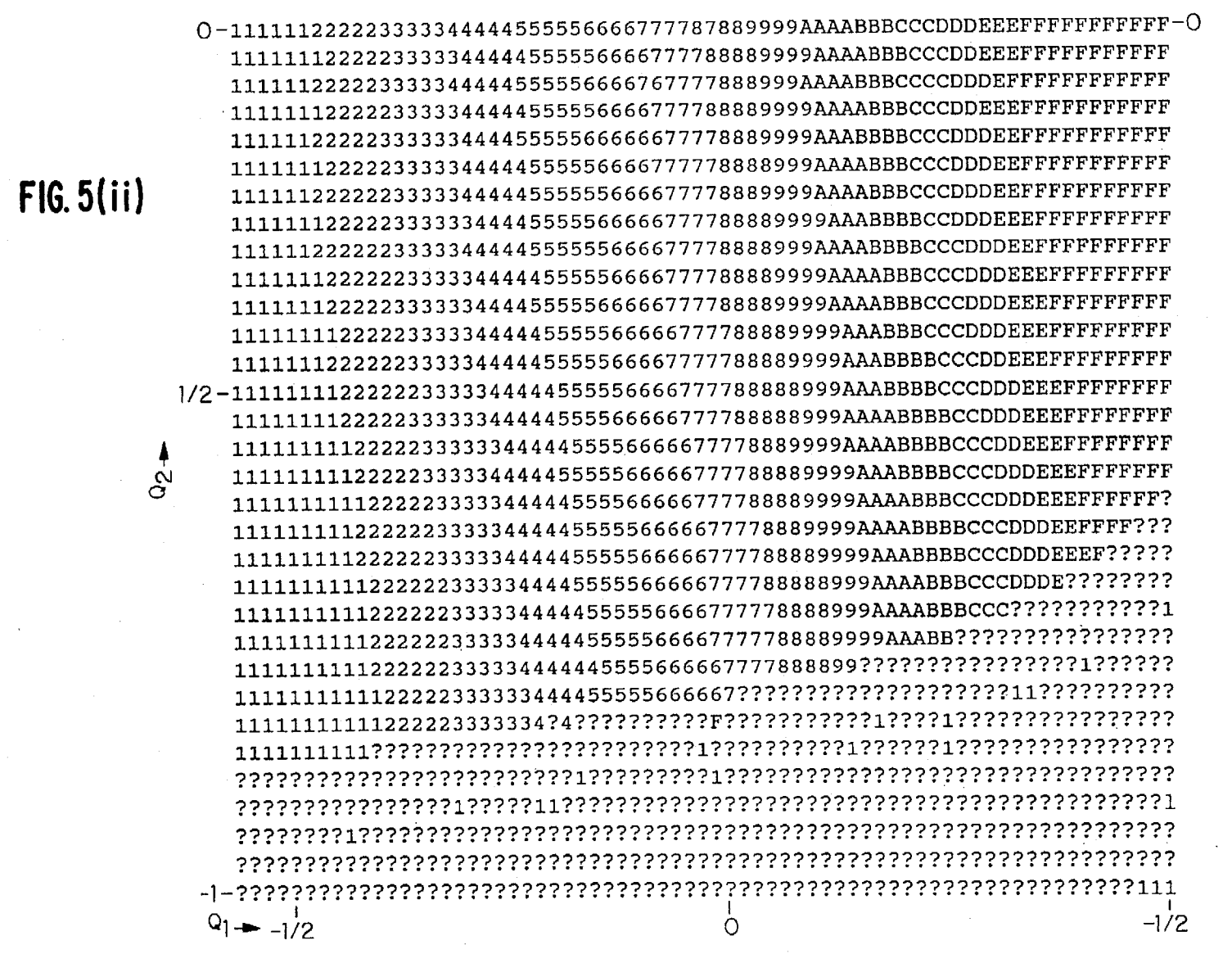
Figure 6A:
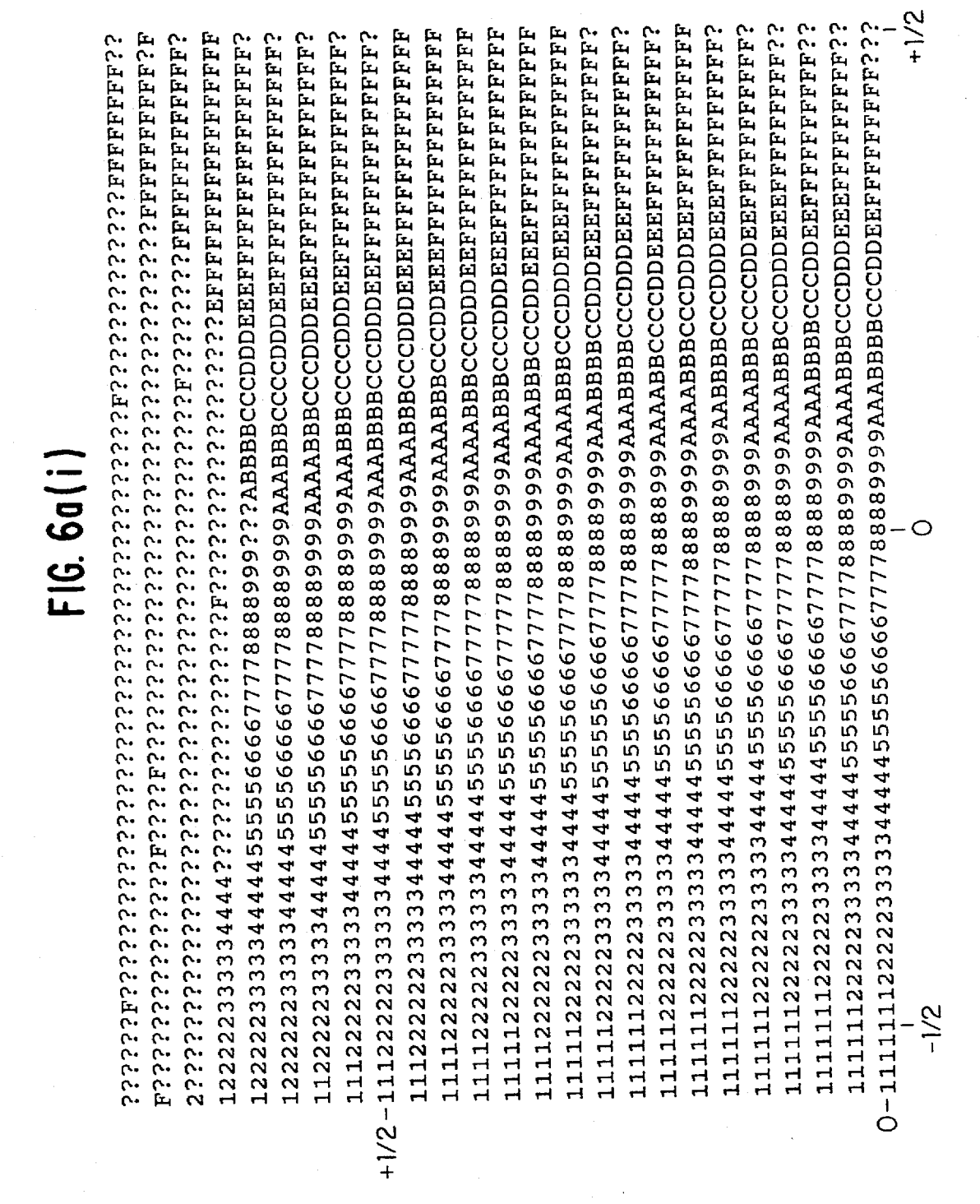
Figure 6A:
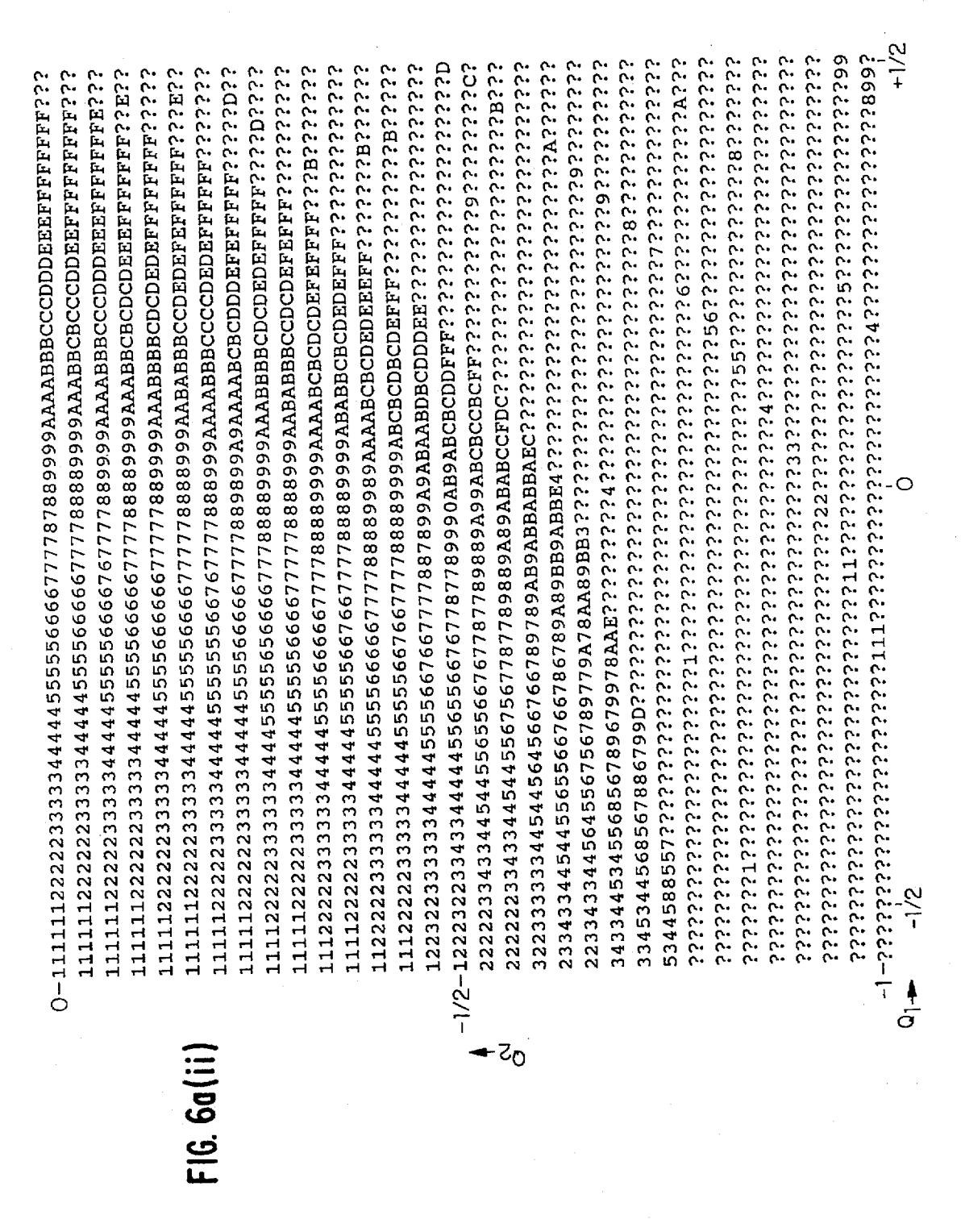
Figure 6B:
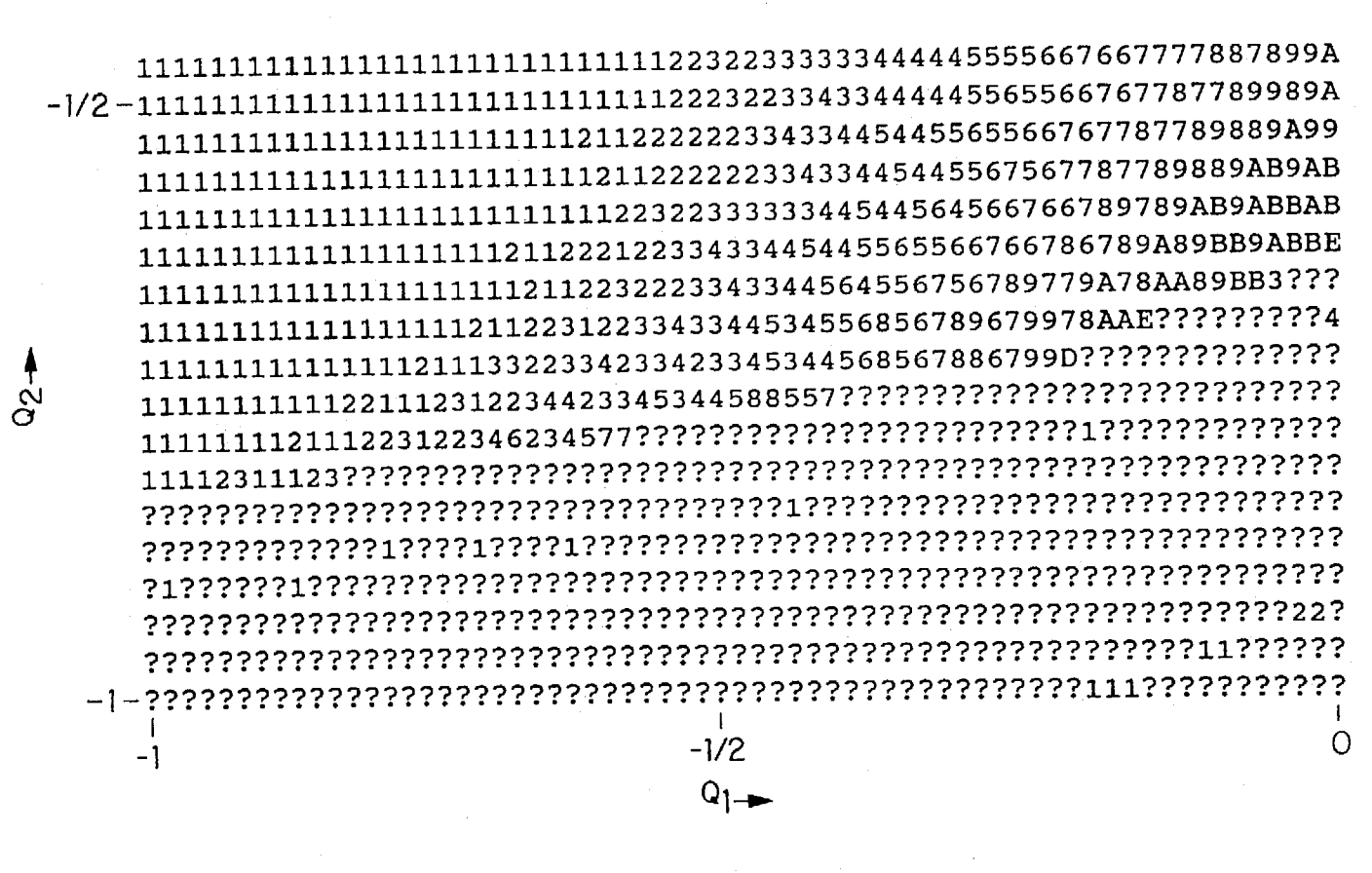

FIG. 5 is a listing of a possible look-ahead ROM, which is to be compared with the corresponding ROM for trailing-edge modulation shown in FIGS. 6(a) and 6(b). These ROMs were generated with K=2, and with quantisation steps of 1/64 for the Q1 quantiser and 1/32 for the Q2 quantiser. The ROM values are shown as hexadecimal digits with an offset of "8", thus "8" represents an edge in its mean position. In the case of consecutive-edge modulation, leading edges are moved to the left by (ROM value-8) bitclocks, while trailing edges are moved to the right by (ROM value-8) bitclocks. In the case of trailing-edge modulation, the numbers represent directly pulse widths in units of the bitclock, in the range 1 to F (15).

(in this document, "negation" of these ROM values refers to negation of the conceptual value, thus "negation" of stored value n is implemented as 16−n.)

For completeness the contents of the simulator ROM for trailing-edge modulation is also listed, see Table 1. (These quantised real numbers are quantised to 28 binary bits in the actual implementation.) In the absence of non-linearity, the peak pulse displacements of +/− 7 bitclocks would result in S0 outputs of +/− 7/16 (i.e. +/− 0.4375), but the non-linearity distributes this "total charge" between the three outputs.

Returning to the ROM listings, FIGS. 5 and 6, a "?" indicates that the non-linear equations implied by FIG. 4 (see pp. 78–79 of the previous application) could not be solved satisfactorily. However these regions of the ROM should not be addressed in normal operation: a special value can be encoded in the ROM here and a monitor can force a system reset in the case that this value is output by the ROM.

In the case of trailing-edge modulation, we do not allow the pulse length to be less than 1 bitclock or to exceed 15 bitclocks, hence the values on the ROM are limited to the range 1 to F. However, for consecutive-edge modulation there is no reason why an edge should not "encroach" on to its neighbours territory, provided of course that the neighbour does not happen to be there at the time. It is advantageous therefore to have a look-ahead ROM wider than 4 bits to allow a wider range of displacements to be encoded, and with this modification, simulation tests have found the noise-shaped consecutive-edge modulator to be stable at peak modulation levels in the range 65–70%.

Alternative Implementations

In the above we have adopted the convention that the numbers entering the pulse modulator move each edge in a direction such that a more positive number leads to a more positive electrical output. However, one could alternatively design the pulse modulator so that each edge is moved in the same direction. This is equivalent to negating the final output of FIG. 3 on alternate samples, and annihilates the conditional negations shown on the output of 1185 and the input of 1182 in FIG. 3.

One can also migrate the conditional negations shown on the inputs of Q1 and Q2, and on the outputs of 1182. In the extreme case, these negations can be replaced by a single conditional negation at the input to the complete circuit, along with the systematic replacement of each occurrence of $z^{-1}$ by $-z^{-1}$ (or generally of $z^n$ by $(-z)^n$.

Whereas sign-alternation has above been viewed as an economical and equivalent strategy to the duplication of ROMs for leading and trailing edges, in fact the use of a duplicated simulator ROM has the advantage that account can be taken of any known discrepancy between the rise-time and shape of leading and trailing edges. With leading or trailing-edge modulation, such discrepancy is not deleterious; however with CEM and non-interleaved noise-shaping, trade-offs are being made between errors on leading and trailing edges. A differing rise-time causes such trade-offs to be less effective, hence this should ideally be properly simulated if the lowest possible noise is required in the audio band.

Figure 9:
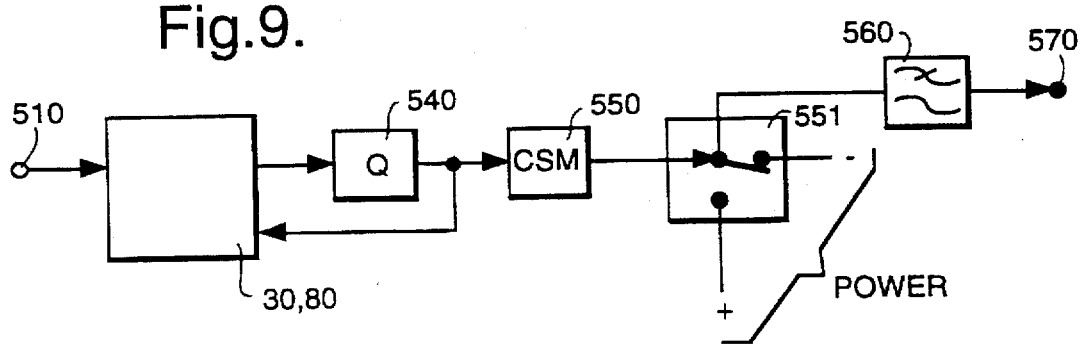
FIG. 9 shows a digital power amplifier.

Converters embodying the present invention may advantageously by used in digital audio power amplifiers such as that shown in FIG. 9. Here a digital audio signal is received at a digital input 510 and fed to a quantiser 540 via a non-linear feedback network 30, 80 as discussed above with reference to FIG. 3.

The output of the quantiser 540 is then fed to a CEM pulse width modulator 550. The output of the pulse width modulator 550 is supplied to the control terminal of a solid state switch 551 positioned in a high power line from a power source to an analogue low pass filter 560 connected to the high power analogue output terminal 570. In order to avoid radio frequency emissions, power dissipation, and other undesirable effects, it is desirable to switch the switch 551 at as low a frequency as possible. This requires the use of a lower oversampling ratio, but at a lower oversampling ratio the noise shaping is less able to reduce quantiser noise. Hence the two-fold increase in oversampling ratio given by the CEM using the present invention is particularly valuable in this application.

Figure 7:
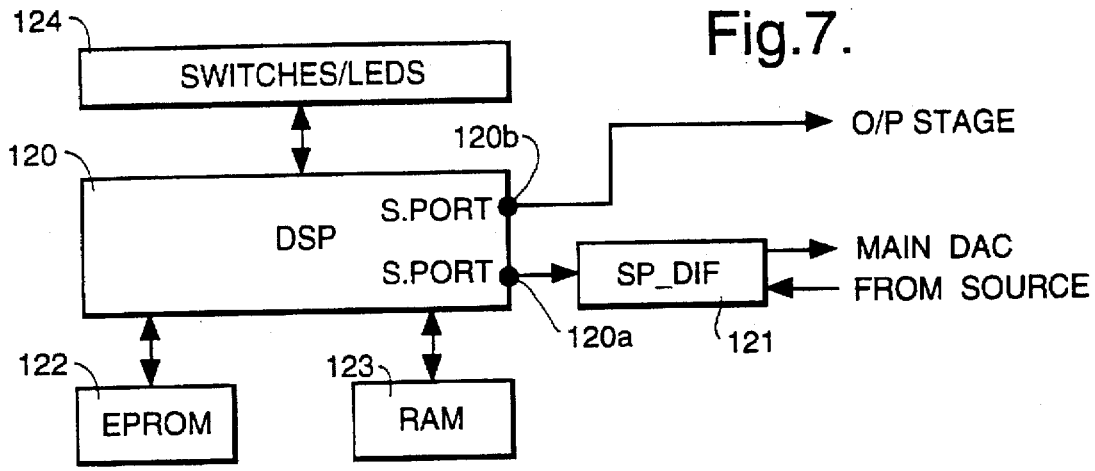
FIG. 7 shows a drive circuit for a sub-woofer.

FIG. 7 shows a further application for a converter embodying the present invention. The converter is used to drive a switching amplifier for a sub-woofer. The circuit uses an integrated DSP 120 which carries out the signal conversion functions. In this example, the DSP is Texas Instruments TMS 320C51. It addresses an Eprom 122 programmed with a look-up table such as that shown in FIG. 5. The DSP 120 has a first serial port 120A connected to an SP-DIF transceiver. The DSP 120 receives via the SP-DIF transceiver 121 the digital output of an appropriate audio source such as CD player. It also outputs via the transceiver 121 and the first port 120A the digital signal for processing by the DAC for the main speakers. The converted output from the DSP120 to drive the sub-woofer is output via a second serial port 120B. This then passes to a switching output stage such as that described above in relation to the power amplifier of FIG. 9, and then via a low-pass filter to the sub-woofer.

The DSP as well as reading data from the Eprom 122 is provided with a region of Ram as a working memory. It also has inputs and outputs connected to switches and LEDs 124 providing an interface for control of the system.

The DSP is programmed to carry out a process of decimation, FIR filtering and interpolation to derive the portion of the audio signal needed to drive the sub-woofer. Although the sub-woofer in this example operates at frequencies up to around 200 Hz, to facilitate analogue low-pass filtering the DSP is arranged to control the noise output up to around 1 kHz, reducing the in-band noise floor to a level equivalent to substantially 19 bits. After derivation of the sub-woofer signal, this is converted and noise-shaped down to 6 bits with non-linearity correction, using different non-linear functions for the trailing and leading edges as discussed above. The output is provided as a CEM signal at a repetition rate of 44.1 kHz and 64 quantisation levels.

To provide enhanced stability, the conversion was implemented with a measure of instantaneous correction, but without using a look ahead ROM. Whereas the system of FIG. 4 terminates the look ahead process by assuming a value for y3 of (y1+y2)/2, if we terminate one stage earlier by assuming y2=y1, then the need for the look ahead line is avoided. This produces a system which is highly stable even with DC inputs. The simulation ROM is calculated by choosing the three values to minimise the sum of the squares of the frequency response error over a set of frequencies over the region of interest. The noise shaping filter is 5th order recursive.

Other circuits embodying the present invention, such as a full range 24-bit DAC, may be implemented using, for example, a 10000 gate FPGA (field programmable gate array).

Figure 10:
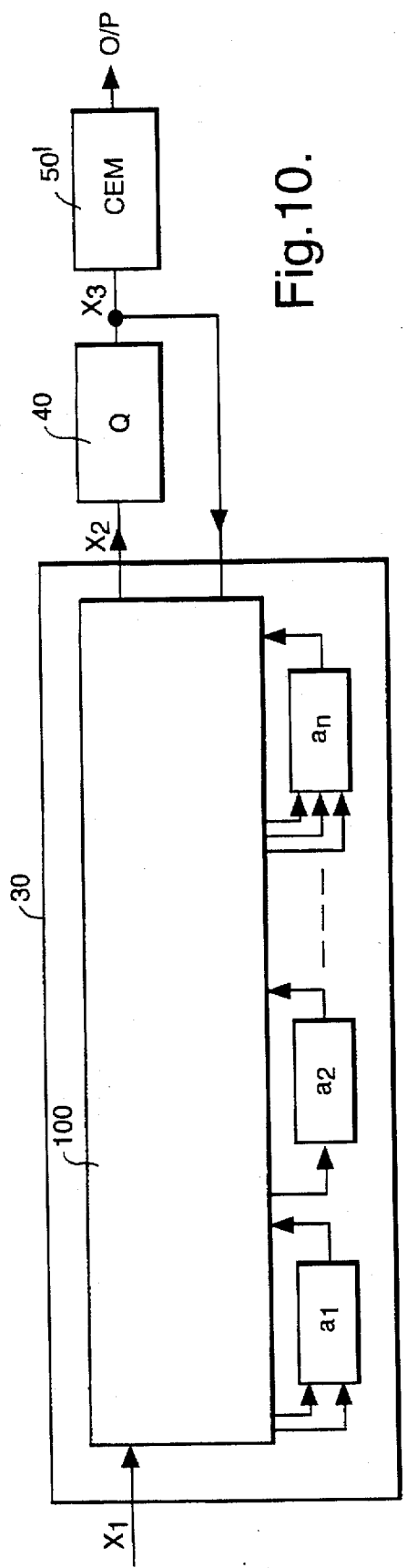
FIG. 10 is a diagram showing a converter embodying the present invention.

FIG. 10 shows a general physical embodiment of the invention, in which an input signal x1 is fed through a network 30 (a "non-linear noise-shaper") so as to produce an output signal x2, which is fed to a quantiser 40, whose output x3 is fed to a consecutive-edge-modulator (CEM) 50' and also back to the network 30.

At this level FIG. 10 is similar to the prior art, FIG. 8, with the substitution of a CEM for the pulse-width-modulator (PWM) of the prior art. However, according to this invention, the network 30 is further composed of a linear network 100, plus non-linearity of the form of one or more "Alternating function generators" (AFGs) $a_1, a_2, \ldots$ an. Each AFT takes one or more inputs and delivers one output: see FIG. 11 and the discussion below.

The linear network 100 receives the input signal x1 and the feedback signal x3, and it furnishes the output signal x2. It also feeds the AFGs and receives the output from each AFG.

The network 100 may include some direct connections; for example its input signal x3 may be fed directly to an input of one of the AFGs, and the output of one of the AFGs may be passed on without further modification as the output x2. Further the quantiser 40 does not necessarily appear as a distinct physical element: as discussed below in some implementations its function will be subsumed by one of the AFGs.

It is inherent that the signal x3 driving the CEM be sampled, and the ordinary embodiment of the invention will be a sampled data system, clocked at the same rate (which, as already discussed, is twice the frequency of the "square wave" whose edges are modulated by the CEM). In this case the linear network 1 will probably include delay stages $z^{-1}$, multiplications by constant coefficients, additions and subtractions.

It is also possible to conceive of embodiments in which some of the signals are continuous-time, or are sampled but at a higher sampling frequency than the input to the CEM. In this case sampler(s) or decimators(s) will need to be included inside 100, and 100 may include continuous-time filters or digital filters operating at the higher sampling rate.

Further, all these possibilities are available with either analogue or digital signals, save that digital signals cannot be continuous in time.

Referring to FIG. 11a an "Alternating Function Generator" takes one or more input signals y1 ... yn, and feeds them to a pair of function generators f1 and ft. A switch S is operated at the same rate as the CEM's square wave, so that at time instants corresponding to leading edges the output f1 is selected as final output z, and at time instants corresponding to trailing edges the output ft is selected.

It is common for the two functions generators f1 and ft to be related by the equation:

$$ft(y) = -f1(-y)$$

in which case the alternative implementation of FIG. 11b may be preferred. Here a single function-generator f is used, and the ganged switches s0, s1, ... sn cause both the input(s) and output of f to be negated on alternate time-instants.

(Note that a fixed non-linearity is a special case of an AFG (f1=fg), and so is a sign-alternating element (by substituting f1(x)=x; ft(x)=-x). Hence the description of FIG. 11(b) does is not fundamentally new as it could be expanded as a number (n+2) of elements of type 11(a)).

Preferred embodiments of the invention can be characterised as those in which the feedback path from the output of the quantiser q back to its input includes non-linearity, and is different for leading edges than for trailing edges. And further, that the non-linearity is "beneficial".

To define this concept more precisely with reference to FIG. 10, it is convenient to assume no redundancy. I.e., if the network 100 has a topology or coefficients such that some of the AFGs have no influence, directly of indirectly, on the output x2, then these AFGs will firstly by removed. We further assume that AFGs implemented as in FIG. 11(b) are, for the purposes of the characterisation, expanded in terms of FIG. 11(a) as explained above.

Embodiments of the invention are now characterised as follows:

1) In at lease one of the AFGs described as in FIG. 11(a), the two function generators f1 and ft are different.

2) In at lease one of the AFGs described as in FIG. 11(a), at least one of the function generators f1 and ft is non-linear. ("Non-linear" means non-linear as a function of the inputs y1 ... yn jointly: for example a multiplier is non-linear, even though it is linear as a function of each of the two inputs individually.

3) The linear network 100 is arranged so that at least one of the inputs y to at least one of the AFGs having different function generators as in (1) above, has a non-zero dependence on the signal x3 that is fed back to 100. Further that the output x2 of 100 has a non-zero dependence on the output of said AFG. For the purpose of assessing dependence indirect dependence via the signal paths through other AFGs is taken into account.

4) The linear network 100 is arranged so that at least one of the inputs y to at least one of the AFGs exhibiting non-linearity as in (2) above, has a non-zero dependence on the signal being x3 that is fed back to 100. Further that the output x2 of 100 has a non-zero dependence, indirect dependence via signal paths through other AFGs is taken into account.

5) The non-linearity in (2) above is such as to reduce the deleterious effect, in the baseband, of the non-linearity inherent in the CEM modulator (as discussed in this application and extensively, in the context of PWM, in [5]). Such reduction could take the form of a) reduction of the "intermodulation noise" discussed in [5] and/or b) ability of the circuit to remain stable at higher modulation levels.

Although FIG. 11(a) provides a natural implementation of a non-linear function computed separately for leading and trailing edges, and likewise FIG. 11(b) provides an alternative and equally natural implementation in the cases satisfying the relationship ft(x)=1f1(-x) it will be understood that the same functionality can be obtained (whether or not the above relationship holds) using other combinations of switchable elements and non-linear elements.

Further, since for example delay elements may be interchanged with non-linear elements (mathematically, the two operations "commute"), and other circuit rearrangements may be effected without affecting functionality, the said switchable elements and non-linear elements may be distributed through the circuit and the said combination is not necessarily identifiable as a connected sub-system of the circuit.

In a digital implementation, the non-linear function generators f1, ft in FIG. 11(a), or f in FIG. 11(b), may be implemented by ROM devices, and in this case each signal input may be conditioned by a pre-quantiser (c.f. Q1, Q2 in FIG. 3) in order to reduce the number of address lines.

A practically important special case is that in which the network 100 feeds the feedback signal y3 directly or indirectly via a $z^{-1}$ delay to a plurality of AFGs. The practical design of FIG. 3 is of this form, where the signal labelled "OUT" is equivalent to the signal y3 in FIG. 10. The delay 1181 in FIG. 3 is considered to be part of the linear network 100 in FIG. 10, and the ROM 1182, together with the sign-reversing elements on its input and outputs, fills the role of 3 AFGs of the form shown in the FIG. 11(b), providing respectively the signals S-1, S0 and S1 (with sign reversal on alternate samples).

The quantiser 40 does not always appear as a physically separate device. This arises because a quantiser is a special case of a function generator. If the output of an AFG is already constrained to take on values which are acceptable as inputs to the modulator m, then the network 100 can pass the output of said AFG directly (or indirectly via a delay or other element that does not destroy the quantised nature of the signal) to its output x2, and then the quantiser 40 need not appear at all.

This aspect is incorporated in FIG. 3, where ROM 1185 is programmed to contain a small number of distinct values, this its output is passed directly (apart from sign-alteration) to the CEM. "OUT" in FIG. 3 is identified with both y2 and y3 in FIG. 10, and there is no quantiser.

In the embodiments described above by way of example ROM devices are used to represent non-linear functions in practical implementations. However, other means, e.g. conditionable memory or real-time solution of equations, having a substantially similar result may of course be substituted.

TABLE 1

| Input | $S_{-1}$ | $S_0$ | $S_1$ | Pulse displacement (bitclocks) |
|---|---|---|---|---|
| 1 | −0.0618237846 | −0.4095816275, | 0.0339054113 | −7 |
| 2 | −0.0439567746 | −0.3574186433, | 0.0263754174 | −6 |
| 3 | −0.0295082826 | −0.3023255511, | 0.0193338334 | −5 |
| 4 | −0.0182342299 | −0.2447906601, | 0.0130248898 | −4 |
| 5 | −0.0098905124 | −0.1853023025, | 0.0076928148 | −3 |
| 6 | −0.0042330031 | −0.1243488288, | 0.0035818320 | −2 |
| 7 | −0.0010175544 | −0.0624186035, | 9.3615786e−4 | −1 |
| 8 | −1.217990e−12 | −2.569877e−14, | 1.243545e−12 | 0 |
| 9 | −9.3615786e−4 | 0.0624186035, | 0.0010175544 | 1 |
| A | −0.0035818320 | 0.1243488288, | 0.0042330031 | 2 |
| B | −0.0076928148 | 0.1853023025, | 0.0098905124 | 3 |
| C | −0.0130248898 | 0.2447906601, | 0.0182342299 | 4 |
| D | −0.0193338334 | 0.3023255511, | 0.0295082826 | 5 |
| E | −0.0263754174 | 0.3574186433, | 0.0439567746 | 6 |
| F | −0.0339054113 | 0.4095816275, | 0.0618237846 | 7 |

REFERENCES

[1] J. M. Goldberg & M. B. Sandler, "Pseudo-Natural Pulse Width Modulation for High Accuracy Digital-to-Analogue Conversion", Electronics Letters vol.27 no.16 pp 1491-2 (August 1991)

[2] M. O. Hawksford, "Dynamic Model-Based Linearisation of Quantized Pulse-With Modulation for Applications in Digital-to-Analog Conversion and Digital Power Amplifier Systems", J. Audio Eng. Soc., vol.40 no.4 pp 235–252 (April 1992)

[3] Y. Matsuya, K. Uchimara, A. Iwata and T. Kaneko, "A 17-bit Oversampling D-to-A Conversion Technology Using Multistage Noise Shaping", IEEE J. of Solid-state Circuits, vol.24 no.4 pp 969–975 (August 1989)

[4] M. A. Gerzon and P. G. Craven, "Optimal Noise Shaping and Dither of Digital Signals" presented at the 87th Convention of the Audio Engineering Society, J. Audio Eng. Soc. (Abstracts), vol.37, p.1072 (1989 Dec.) preprint 2822.

[5] P. G. Craven, "Toward the 24-bit DAC: Novel Noise-Shaping Topologies Incorporating Correction for the Non-linearity in a PWM Output Stage", J. Audio Eng. Soc, vol 41, No. 5, Pp.291–313 (May 1993).

I claim:

1. A digital converter including a consecutive edge modulator (50'), and a noise-shaping circuit (30) arranged to modify the input to the consecutive edge modulator in dependence upon values corresponding to an output of the consecutive edge modulator, characterised in that the noise-shaping circuit (30) is arranged to apply different respective non-linear functions to samples at time instants corresponding to trailing-edge and leading-edge outputs respectively of the consecutive edge modulator.

2. A digital converter including a consecutive edge modulator (50), and a noise-shaping circuit (30) arranged to modify the input to the consecutive edge modulator in dependence upon values corresponding to an output of the consecutive edge modulator, characterised in that the noise-shaping applied to the input of the consecutive edge modulator is effective at an oversampling frequency equal to twice the switching frequency of the output of the consecutive edge modulator and in that the level of noise-reduction within the baseband effected by the noise-shaping circuit is substantially independent of the signal modulation level.

3. A converter according to claim 1, including a quantiser (40), the output of the quantiser being connected to the consecutive edge modulator (50) and in which the noise-shaping circuit is connected in a feedback-loop around the quantiser and modifies the input to the quantiser.

4. A digital converter according to claim 1, in which the noise-shaping circuit (30) includes a simulator circuit (80) arranged to generate an output dependent upon the non-linear response of the converter including the consecutive edge modulator to a sample.

5. A digital converter according to claim 4, in which the simulator circuit includes a look-up table (82a–e) programmed with data modelling the said non-linear response.

6. A digital converter according to claim 5, in which the look-up table (82a–e) is addressed by the output of a quantiser (40).

7. A converter according to claim 1, in which the noise-shaping circuit (80) is arranged to generate a correction for a current input to the consecutive edge modulator dependent at least in part upon a preceding output of the consecutive edge modulator.

8. A converter according to claim 7, in which the noise-shaping circuit (80) is arranged to generate a correction for a current input to the consecutive edge modulator dependent also a least in part upon a calculated value substantially corresponding to a current output of the consecutive edge modulator.

9. A converter according to claim 8, in which the noise-shaping circuit (80) includes a delay stage and is arranged to generate a correction for a current input to the consecutive edge modulator dependent also at least in part upon a calculated value substantially corresponding to a succeeding output of the consecutive edge modulator.

10. A converter according to claim 1, in which the noise-shaping circuit includes a non-linear processor and means for conditionally negating one or more inputs and/or outputs to/from the non-linear processor, the non-linear processor and means for conditionally negating in combination thereby applying different respective non-linear functions to samples at time instants corresponding respectively to trailing-edge and leading-edge outputs of the consecutive edge modulator.

11. A digital power amplifier including a digital converter according to claim 1.

12. A method of operating a digital converter including a consecutive edge modulator, the method including applying noise-shaping to the input to the consecutive edge modulator, characterised by applying different respective non-linear functions to samples at time instants corresponding to trailing edge and leading edge outputs respectively of the consecutive edge modulator.

13. A method of operating a digital converter including a consecutive edge modulator, the method including applying noise-shaping to the input to the consecutive edge modulator, characterised in that the noise shaping is effective at an oversampling frequency equal to twice the switching frequency of the output of the consecutive edge modulator and in that the level of noise-reduction within the baseband effected by the noise-shaping circuit is substantially independent of the signal modulation level.

14. A method according to claim 12, in which the step of applying noise shaping includes applying a non-linear function to a current input to the consecutive edge modulator dependent at least in part upon a preceding output of the consecutive edge modulator.

15. A method according to claim 14 in which the step of applying noise shaping includes applying a non-linear function to a current input to the consecutive edge modulator dependent at least in part also upon a calculated value substantially corresponding to a current output of the consecutive edge modulator.

16. A method according to claim 15 in which the step of applying noise shaping includes applying a non-linear function to a current input to the consecutive edge modulator dependent at least in part also upon a calculated value substantially corresponding to a succeeding output of the consecutive edge modulator.

17. A digital converter including an input for a signal to be converted;

means for generating a quantised signal from the said signal to be converted;

a consecutive edge modulator connected to the said means for generating;

and a noise shaping circuit connected in the input path to said consecutive edge modulator;

wherein said noise shaping circuit includes means for applying different respective functions to input samples corresponding to trailing edge and leading edge outputs of said consecutive edge modulator.

18. The digital converter of claim 17, wherein at least one of said different respective functions is a non-linear function.

19. A converter according to claim 2, including a quantiser (40), the output of the quantiser being connected to the consecutive edge modulator (50) and in which the noise-shaping circuit is connected in a feedback-loop around the quantiser and modifies the input to the quantiser.

20. A digital converter according to claim 2, in which the noise-shaping circuit (30) includes a simulator circuit (80) arranged to generate an output dependent upon the non-linear response of the converter including the consecutive edge modulator to a sample.

21. A converter according to claim 2, in which the noise-shaping circuit (80) is arranged to generate a correction for a current input to the consecutive edge modulator dependent at least in part upon a preceding output of the consecutive edge modulator.

22. A converter according to claim 2, in which the noise-shaping circuit includes a non-linear processor and means for conditionally negating one or more inputs and/or outputs to/from the non-linear processor, the non-linear processor and means for conditionally negating in combination thereby applying different respective non-linear functions to samples at time instants corresponding respectively to trailing-edge and leading-edge outputs of the consecutive edge modulator.

23. A digital power amplifier including a digital converter according to claim 2.

24. A method according to claim 13, in which the step of applying noise shaping includes applying a non-linear function to a current input to the consecutive edge modulator dependent at least in part upon a preceding output of the consecutive edge modulator.

25. A method according to claim 24 in which the step of applying noise shaping includes applying a non-linear function to a current input to the consecutive edge modulator dependent at least in part also upon a calculated value substantially corresponding to a current output of the consecutive edge modulator.

26. A method according to claim 24 in which the step of applying noise shaping includes applying a non-linear function to a current input to the consecutive edge modulator dependent at least in part also upon a calculated value substantially corresponding to a succeeding output of the consecutive edge modulator.

* * * * *